(12) United States Patent
Liu et al.

(10) Patent No.: US 8,199,496 B2
(45) Date of Patent: Jun. 12, 2012

(54) VACUUM LATCH STRUCTURE AND CLAM TYPE ELECTRONIC DEVICE USING THE SAME

(75) Inventors: Tsung-Chin Liu, Taipei County (TW); Yung-Yu Lu, Taoyuan County (TW)

(73) Assignee: Quanta Computer Inc., Taoyuan Shien (TW)

( * ) Notice: Subject to any disclaimer, the term of this patent is extended or adjusted under 35 U.S.C. 154(b) by 267 days.

(21) Appl. No.: 12/656,917

(22) Filed: Feb. 19, 2010

(65) Prior Publication Data
US 2011/0058316 A1    Mar. 10, 2011

(30) Foreign Application Priority Data
Sep. 7, 2009   (TW) .............................. 98216491 U

(51) Int. Cl.
*G06F 1/16*   (2006.01)
(52) U.S. Cl. ......... 361/679.58; 361/679.02; 361/679.27; 361/679.57; 312/223.1; 312/223.2

(58) Field of Classification Search ............. 361/679.27, 361/679.57, 679.58
See application file for complete search history.

(56) References Cited

U.S. PATENT DOCUMENTS

| | | | | |
|---|---|---|---|---|
| 5,436,567 A * | 7/1995 | Wexler et al. | ............. | 324/750.2 |
| 6,152,414 A * | 11/2000 | Jondrow | .................. | 248/346.03 |
| 7,609,514 B2 * | 10/2009 | Doczy et al. | ............. | 361/679.58 |
| 2005/0088812 A1 * | 4/2005 | Hillman et al. | ............... | 361/683 |
| 2005/0236538 A1 * | 10/2005 | Schmidt et al. | ............ | 248/205.5 |
| 2006/0133019 A1 * | 6/2006 | Yamazaki et al. | ............ | 361/683 |

* cited by examiner

*Primary Examiner* — Anthony Q Edwards
(74) *Attorney, Agent, or Firm* — Rabin & Berdo, PC

(57) ABSTRACT

A vacuum latch structure and a clam type electronic device are provided. The clam type electronic device includes a first case, a second case and the vacuum latch structure. The second case is pivotally connected to the first case to cover the first case. The vacuum latch structure has a driving element and a sucker. The driving element is movably disposed on the first case. The sucker includes a suction cup for attaching to the second case and a pulling rod that is connected to both the suction cup and the driving element. The suction cup is lifted by the pulling rod when the pulling rod is driven by the driving element.

20 Claims, 5 Drawing Sheets

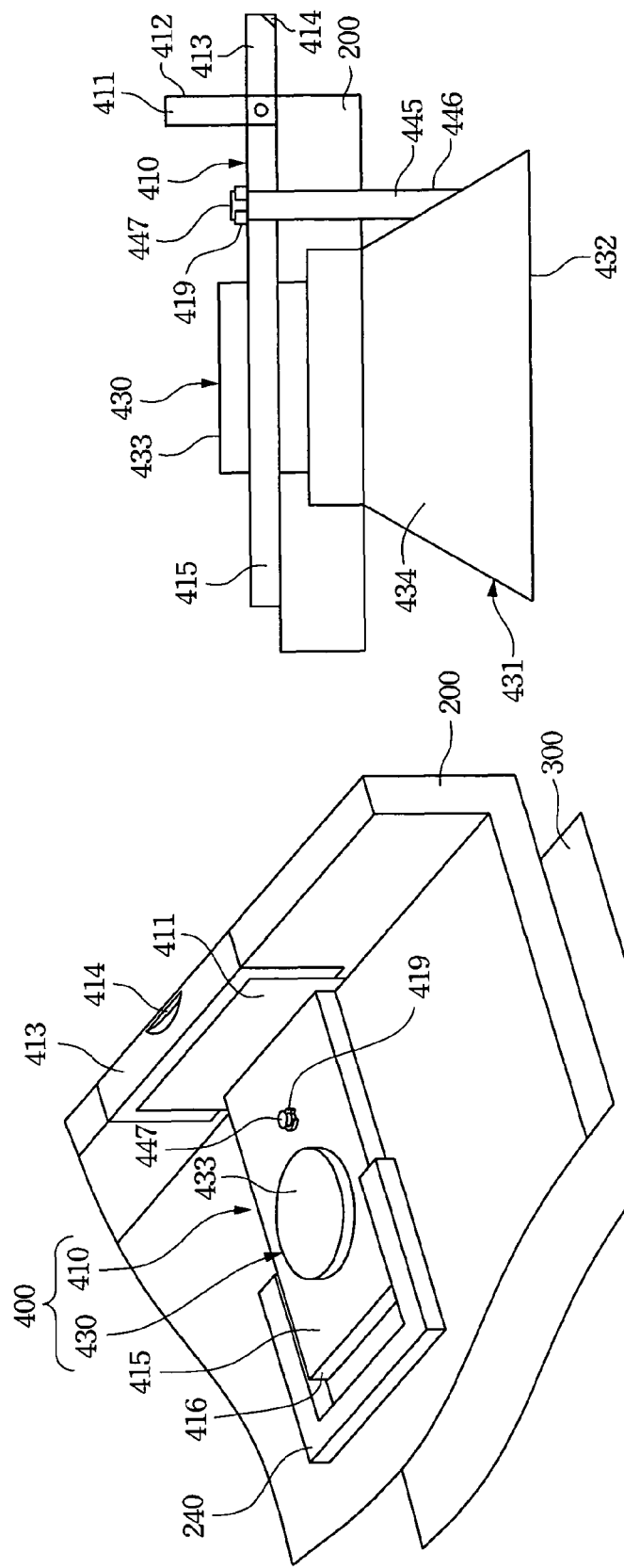

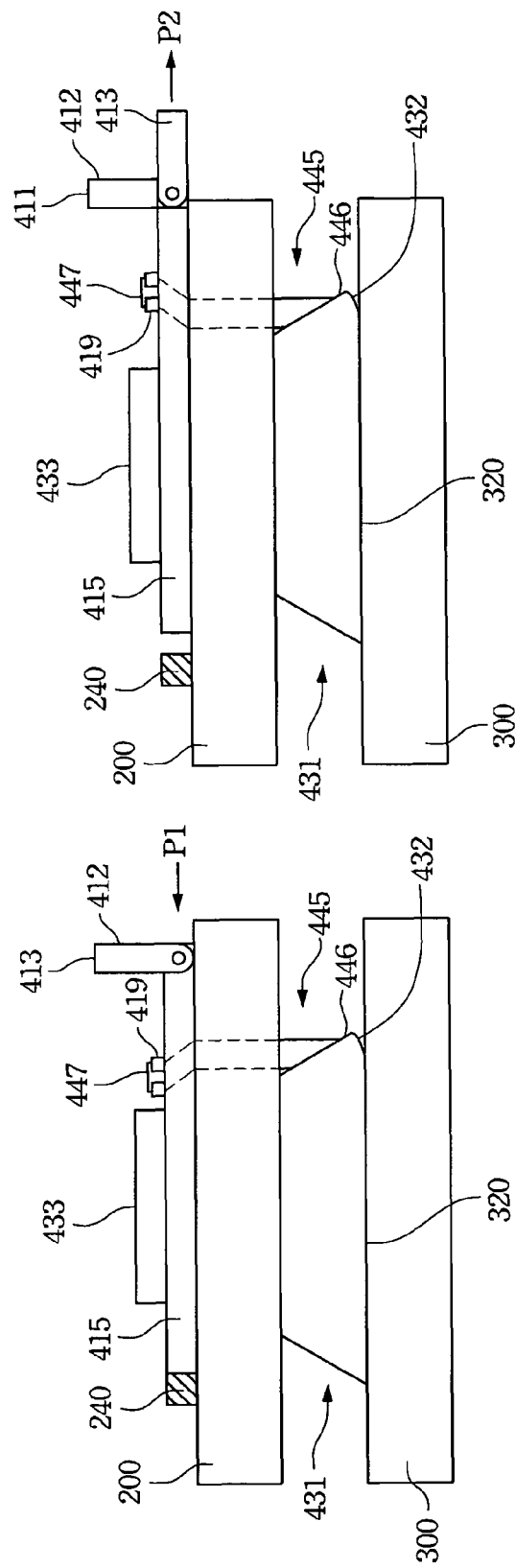

VACUUM LATCH STRUCTURE AND CLAM TYPE ELECTRONIC DEVICE USING THE SAME

RELATED APPLICATIONS

This application claims priority to Taiwan Application Serial Number 98216491, filed Sep. 7, 2009, which is herein incorporated by reference.

BACKGROUND

1. Technical Field

The present invention relates to a clam type electronic device. More particularly, the present invention relates to a clam type electronic device having a vacuum latch structure.

2. Description of Related Art

In a known locking mechanism of a laptop computer (notebook), one or several switch structures including hooks and fastening troughs are utilized to effectively lock an upper case with a lower case of the laptop computer. The upper case of the laptop computer includes a push button, an operating rod, a spring and a fastening hook. The lower case of the laptop computer includes a fastening trough. While closing the laptop computer, firstly, the upper case is rotated toward the lower case. Afterwards, the fastening hook, the operating rod, the spring and the push button are shifted, so that the hook is fastened with the fastening trough. As a result, the upper case can be locked with the lower case. On the other hand, while opening the laptop computer, firstly, the push button at the front of the upper case is pressed, so that the fastening hook is released from the fastening trough. Then the upper case can be pivoted away from the lower case to an open position.

Due to the reason that the fragile display screen is usually disposed in the upper case, several elastic elements, such as several rubber buffer pads, are commonly disposed on the contact surfaces of the upper case and the lower case to absorb the shock of closing the cases. So that the impact from closing the upper case relative to the lower case can be alleviated, and the damage of the display screen can be prevented.

However, the switch structures including hooks and fastening troughs require not only an expense of manufacturing the molds but a reserved space within the laptop computer to contain the switch structures also. This makes the switch structures quite costly. On the other hand, if these switch structures are discarded from the laptop computer, the upper case will not be able to firmly lock with the lower case. In addition, these elastic elements also require is spaces on the upper case and the lower case to fix these elastic elements.

Therefore, it is now an important topic for the manufacturers to overcome the drawback of high manufacturing cost yet retain an effective locking force and buffering function at the same time.

SUMMARY

A vacuum latch structure and a clam type electronic device using the same are provided. The vacuum latch structure is to replace known latching structures of hooks and fastening troughs, therefore the inner space of the electronic device is increased, the material cost is reduced, and the labor cost is lowered. Further, the vacuum latch structure also provides a locking force between the upper case and the lower case, and can be regarded as a buffer between the two cases.

According to one aspect of the disclosure, in the clam type electronic device including the vacuum latch structure, a buffer solution for the electronic device in a closed state is provided by the vacuum latch structure.

The clam type electronic device includes a first case, a second case and a vacuum latch structure. The second case is pivotally connected to the first case to cover the first case. The vacuum latch structure includes a driving element and a sucker. The driving element is movably disposed on the first case. The sucker includes a suction cup and a pulling rod. The suction cup is disposed on a surface of the first case for covering the second case and is used for attaching to the second case. The pulling rod is connected to the suction cup and the driving element. The suction cup is lifted by the pulling rod when the pulling rod is driven by the driving element.

According to one embodiment of the disclosure, the suction cup is made of an elastically deformable and gas impermeable material. The elastically deformable and gas permeable material is rubber, silicone, plastic or any combinations thereof. The suction cup further includes a cone slope, and the pulling rod is connected to the cone slope.

According to one embodiment of the disclosure, the first case has a linear path. The driving element is movable back and forth in the linear path.

In the present embodiment, the driving element includes a U-shaped puller that is pivotally connected to the driving element.

According to one embodiment of the disclosure, the driving element has a first through hole and a second through hole. The suction cup has an attaching end and an opposite fixing end. The pulling rod has a first end and an opposite second end. The fixing end is fixed in the first through hole. The attaching end faces the second case. The first end of the pulling rod is connected to the suction cup. The second end of the pulling rod is fixed in the second through hole.

According to one embodiment of the disclosure, the vacuum latch structure of the clam type electronic device includes a detaching means for lifting the sucker.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows:

FIG. 2 is an assembled diagram of the vacuum latch structure of FIG. 1;

FIG. 3 is a side-view of the vacuum latch structure of the clam type electronic device according to the present embodiment of the invention;

FIG. 5 is a perspective diagram of the vacuum latch structure of the present embodiment in a using mode; and FIG. 6 is a perspective diagram of the vacuum latch structure of the present embodiment in another using mode.

DETAILED DESCRIPTION

Figure 1:
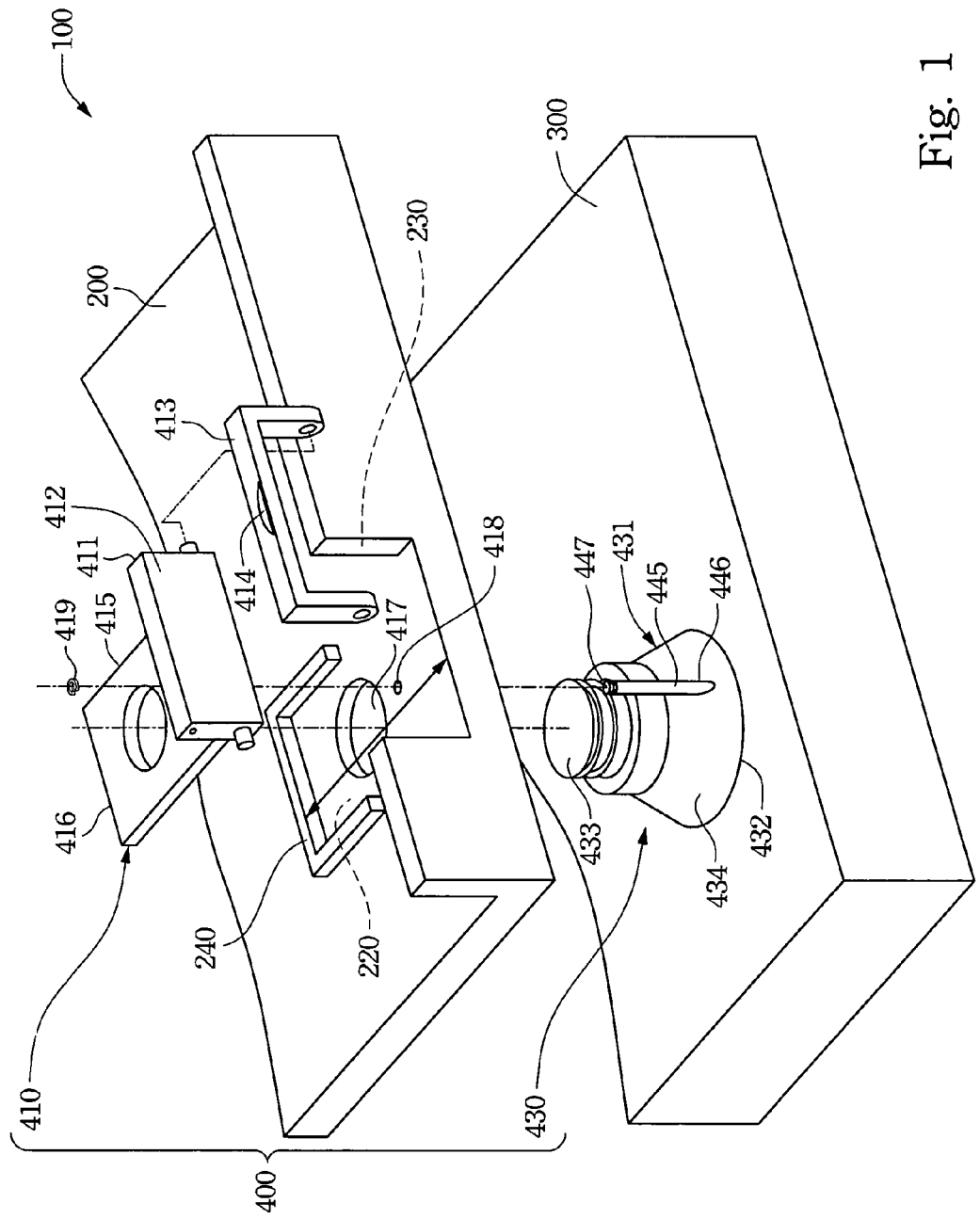
FIG. 1 is an exploded diagram of a vacuum latch structure of a clam type electronic device according to one embodiment of the invention.

Reference will now be made in detail to the present embodiments of the invention, examples of which are illustrated in the accompanying drawings. Wherever possible, the same reference numbers are used in the drawings and the description to refer to the same or like parts.

FIG. 1 is an exploded diagram of a vacuum latch structure of a clam type electronic device according to one embodiment of the invention. FIG. 2 is an assembled diagram of the vacuum latch structure of FIG. 1. With referring to FIG. 1 and FIG. 2 at the same time, a clam type electronic device having a vacuum latch structure is provided in one embodiment of the invention. The clam type electronic device 100 includes a first case 200, a second case 300 and a vacuum latch structure 400.

The second case 300 is pivotally connected to the first case 200 to cover the first case 200. The vacuum latch structure 400 includes at least one driving element 410 and at least one sucker 430. The driving element 410 is served as a detaching means for releasing the sucker 430 so that the sucker 430 is unable to attach to the second case 300. The driving element 410 is movably disposed on the first case 200. The sucker 430 includes a suction cup 431 and a pulling rod 445. The suction cup 431 is disposed on a surface of the first case 200 that is used for covering the second case 300. The pulling rod 445 is connected to the suction cup 431 and the driving element 410 with two opposite ends thereof.

FIG. 3 is a side-view of the vacuum latch structure of the clam type electronic device according to the present embodiment of the invention. When a user let the first case 200 close relative to the second case 300, the suction cup 431 is in direct contact with the second case 300 and the suction cup 431 enters a vacuum state to attach to the second case 300. Through the attachment of the suction cup 431 to the second case 300, the first case 200 is connected to the second case 300, and a locking force is provided between the first case 200 and the second case 300. Moreover, the suction cup 431 can serve as a buffer between the first case 200 and the second case 300 when the first case 200 is closed relative to the second case 300.

According to one embodiment of the invention, the sucker 430 is made of an elastically deformable and gas impermeable material such as rubber, silicone, plastic or any combinations thereof. The suction cup 431 has an attaching end 432 and an opposite fixing end 433. The attaching end 432 faces the second case 300 and its outer surface has a cone slope 434. The fixing end 433 is fixed on the first case 200. The pulling rod 445 has a first end 446 and an opposite second end 447. The first end 446 is vertically connected to the cone slope 434 and the second end 447 is connected to the driving element 410. The suction cup 431 and the pulling rod 445 can be formed either in one-piece or in two different pieces.

In the following description, the clam type electronic device 100 is exemplified by a laptop computer (notebook). However, the descriptions are not exclusively applicable to a laptop computer. The clam type electronic device 100 can also be a mobile phone or other hand-held devices with pivotally connected cases.

Figure 4A:
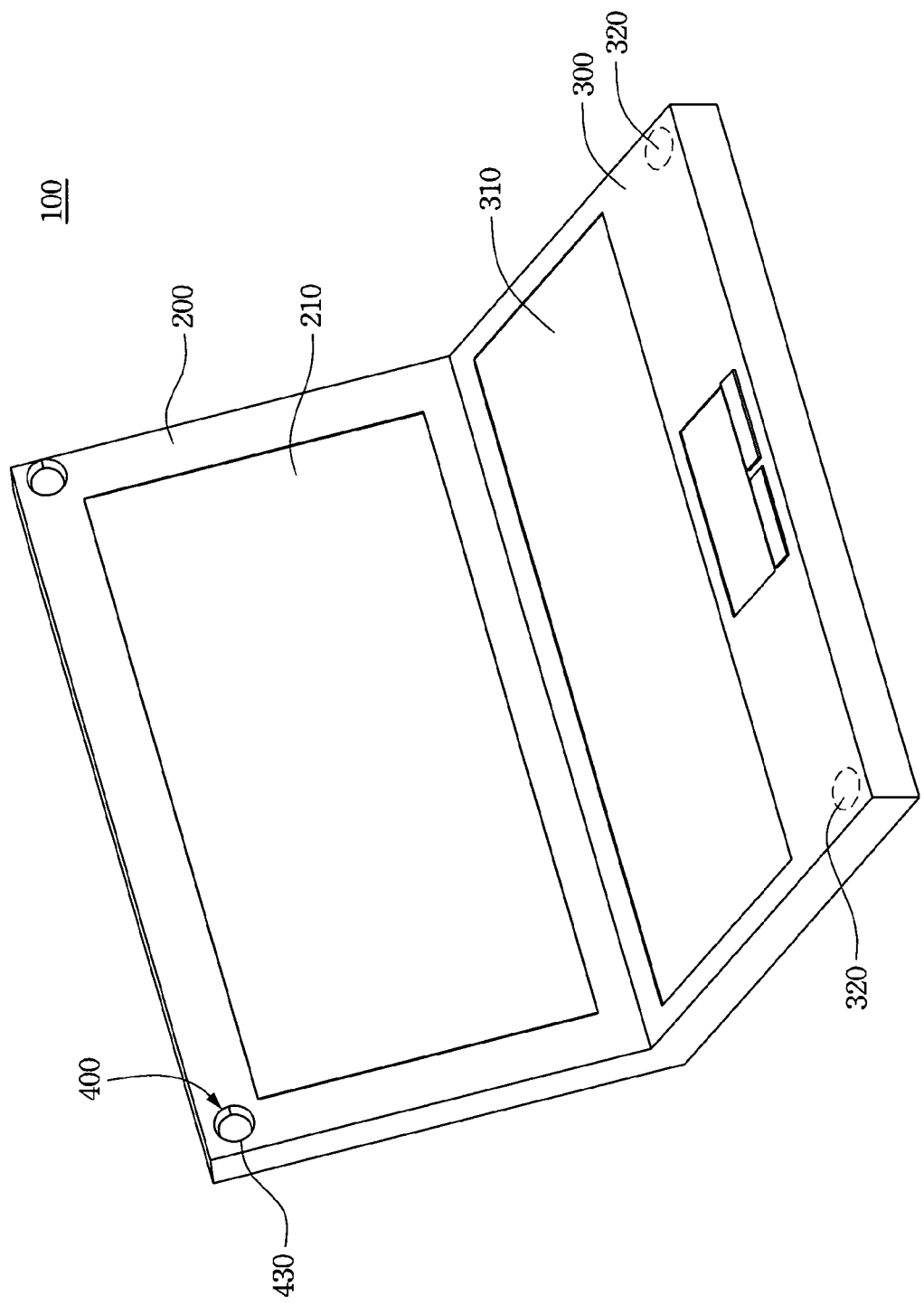
FIG. 4A is a three-dimensional diagram of a clam type electronic device according to one embodiment of the invention.
Figure 4B:
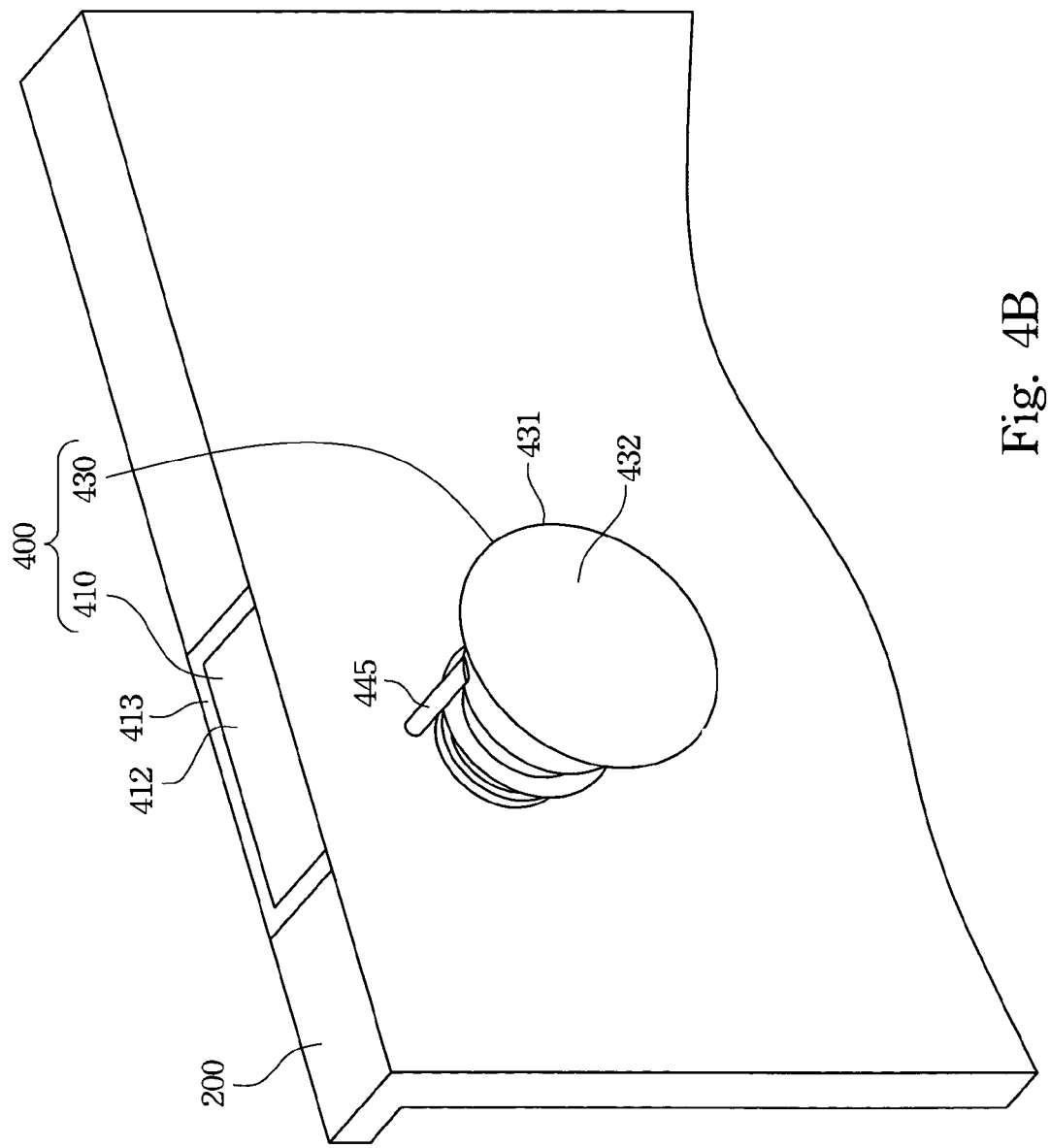
FIG. 4B is an enlarged perspective diagram of the vacuum latch structure in FIG. 4A.

FIG. 4A is a three-dimensional diagram of a clam type electronic device according to one embodiment of the invention. FIG. 4B is an enlarged perspective diagram of the vacuum latch structure in FIG. 4A. With referring to FIG. 1, FIG. 4A and FIG. 4B at the same time, the first case 200 is served as a front case of the laptop computer that reveals the screen 210; that is, the LCD front bezel. The second case 300 is served as a bottom case of the laptop computer that reveals the keyboard 310. A corresponding surface 320 of the second case 300 that faces toward the attaching end 432 is provided with one or more characteristics for matching with the attach-ing end 432. For example, is the corresponding surface 320 is a flat surface and is made of a gas impermeable material.

In the present embodiment, the first case 200 has a linear path 220, an opening 230 and a blocking element 240. The linear path 220 is provided at a surface of the first case 200 not facing the second case 300. The opening 230 is disposed on the surface of the first case 200 and is aligned with one end of the linear path 220. The blocking element 240 is disposed at the other end of the linear path 220 that is far away from the opening 230.

The driving element 410 is a rigid plate that is in a form of L-shape for example, and includes a vertical portion 411 and a horizontal portion 415. The driving element 410 is movable back and forth in the linear path 220. The vertical portion 411 has a pressing surface 412 exposed from the first case 200. The horizontal portion 415 has a contact surface 416 facing the blocking element 240. The driving element 410 has two through holes on the horizontal portion 415. Two through holes of the driving element 410 corresponds to a first through hole 417 and a second through hole 418 of the first case 200 respectively. The fixing end 433 passes through the first case 200 and the horizontal portion 415 of the driving element 410 and be fixed in the first through hole 417. The first end 446 of the pulling rod 445 is connected to the suction cup 431. The second end 447 of the pulling rod 445 passes through the first case 200 and the horizontal portion 415 of the driving element 410 and be fixed in the second through hole 418. In one embodiment, the second end 447 of the pulling rod 445 is fixed in the second through hole 418 through a C-shaped clip 419.

FIG. 5 is a perspective diagram of the vacuum latch structure of the present embodiment in a using mode. While detaching the first case 200 from the second case 300, the user applies a force P1 to the pressing surface 412 to push the driving element 410. Through the linear movement of the driving element 410 in the linear path 220, the second end 447 of the pulling rod 445 is moved accordingly. Therefore the suction cup 431 is pulled and lifted by the first end 446 of the pulling rod 445, letting the air enter the suction cup 431. Then the suction cup 431 leaves the vacuum state. Consequently, the locking force between the first case 200 and the second case 300 is removed, and the first case 200 can rotate away from the second case 300.

With referring to FIG. 4A and FIG. 4B, after the user stops pushing the pressing surface 412, the sucker 410 restores to the before-lifted-state through its elasticity. Therefore spring is needless in the vacuum latch structure 400 of the present embodiment. The blocking element 240 is used for blocking the contact surface 416 to avoid the sucker 430 being over deformed and to prevent the sucker 430 from being damaged.

In the present embodiment, the driving element 410 further includes a U-shaped puller 413. Two ends of the U-shaped puller 413 are pivotally connected to two corresponding sides of the driving element 410 where the vertical portion 411 connects to the horizontal portion 415 (not solely limited to the vertical portion 411 or the horizontal portion 415). Further, a notch 414 is formed on one surface of the U-shaped puller 413.

When the vacuum latch structure 400 is not in use, the U-shaped puller 413 is pivoted into the opening 230 of the first case 200. The U-shaped puller 413 spans over the vertical portion 411, and thus the U-shaped puller 413 and the vertical portion 411 form a flat surface at the opening 230. On the other hand, as shown in FIG. 6, which is a perspective diagram of the vacuum latch structure of the present embodiment in another using mode, the user can pull the U-shaped puller 413 out of the opening 230 of the first case 200 through the notch 414. Therefore, when the user applies a force P2 to move the driving element 410, the suction cup 431 leaves the vacuum state.

Although the present invention has been described in considerable detail with reference to certain embodiments thereof, other embodiments are possible. For example, the first case 200 can also be the bottom case of the laptop computer that reveals the keyboard 310. The second case 300 can also be the front case of the laptop computer that reveals the screen 210, i.e. the LCD front bezel. Further, the pulling rod 445 and its corresponding second through hole 418 are not limited to be disposed on a side near the opening 230 as shown in FIG. 1. They can also be disposed on a side near the blocking element 240.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A vacuum latch structure for using on a clam type electronic device, the vacuum latch structure comprising:
   a driving element; and
   a sucker comprising:
      a suction cup disposed on the driving element; and
      a pulling rod being connected to the suction cup with a first end thereof and connected to the driving element with an opposite second end thereof, wherein the suction cup is lifted by the pulling rod when the pulling rod is driven by the driving element.

2. The vacuum latch structure of claim 1, wherein the driving element comprises a U-shaped puller pivotally connected to the driving element.

3. The vacuum latch structure of claim 1, wherein the suction cup is made of an elastically deformable and gas impermeable material.

4. The vacuum latch structure of claim 3, wherein the elastically deformable and gas impermeable material is rubber, silicone, plastic or any combinations thereof.

5. The vacuum latch structure of claim 1, wherein the suction cup and the pulling rod are made in one piece.

6. The vacuum latch structure of claim 1, wherein the suction cup comprises a cone slope to which the pulling rod is connected.

7. A clam type electronic device, comprising:
   a first case;
   a second case pivotally connected to the first case to cover the first case; and
   a vacuum latch structure, comprising:
      a driving element movably disposed on the first case; and
      to a sucker comprising a suction cup and a pulling rod, wherein the suction cup is disposed on a surface of the first case for covering the second case and the suction cup is used for attaching to the second case, and the pulling rod is connected to the suction cup and is connected to the driving element, wherein the suction cup is lifted by the pulling rod when the pulling rod is driven by the driving element.

8. The clam type electronic device of claim 7, wherein the first case has a linear path where the driving element is movable back and forth.

9. The clam type electronic device of claim 8, wherein the driving element comprises a U-shaped puller whose two ends are pivotally connected to the driving element.

10. The clam type electronic device of claim 7, wherein the driving element has a first through hole and a second through hole, the suction cup has an attaching end and an opposite fixing end, and the pulling rod has a first end and an opposite second end, wherein the fixing end is fixed in the first through hole and the attaching end faces the second case, and the first end of the pulling rod is connected to the suction cup and the second end of the pulling rod is fixed in the second through hole.

11. The clam type electronic device of claim 7, wherein the suction cup is made of an elastically deformable and gas impermeable material.

12. The clam type electronic device of claim 11, wherein the elastically deformable and gas impermeable material is rubber, silicone, plastic or any combinations thereof.

13. The clam type electronic device of claim 7, wherein the suction cup and the pulling rod are made in one piece.

14. The clam type electronic device of claim 7, wherein the suction cup comprises a cone slope to which the pulling rod is connected.

15. A clam type electronic device, comprising:
   a first case;
   a second case pivotally connected to the first case to cover the first case; and
   a vacuum latch structure, comprising:
      a sucker for attaching to the second case and disposed on a surface of the first case for covering the second case; and
      a detaching means for lifting the sucker.

16. The clam type electronic device of claim 15, wherein the first case has a linear path where the detaching means is movable back and forth.

17. The claim type electronic device of claim 16, wherein the detaching means comprises a U-shaped puller whose two ends are pivotally connected to the detaching means.

18. The clam type electronic device of claim 17, wherein the detaching means has a first through hole and a second through hole, the sucker comprises a pulling rod and has an attaching end and an opposite fixing end, and the pulling rod has a first end and an opposite second end, wherein the fixing end is fixed in the first through hole and the attaching end faces the second case, and the first end of the pulling rod is connected to the sucker and the second end of the pulling rod is fixed in the second through hole.

19. The clam type electronic device of claim 18, wherein the sucker comprises a cone slope to which the first end of the pulling rod is connected.

20. The clam type electronic device of claim 19, wherein the clam type electronic device comprises a laptop computer or a mobile phone.

* * * * *